(12) United States Patent
Kim et al.

(10) Patent No.: US 10,108,759 B2
(45) Date of Patent: Oct. 23, 2018

(54) METHOD FOR OPTIMIZATION OF FUEL CELLS OPERATING CONDITIONS USING HYBRID MODEL

(71) Applicant: KOREA INSTITUTE OF ENERGY RESEARCH, Daejeon (KR)

(72) Inventors: Minjin Kim, Daejeon (KR);
Young-Jun Sohn, Daejeon (KR);
Gu-Gon Park, Daejeon (KR);
Byungchan Bae, Seoul (KR);
Sung-Dae Yim, Daejeon (KR);
Young-Woo Choi, Cheongju-si (KR);
Seok-Hee Park, Daejeon (KR);
Tae-Hyun Yang, Daejeon (KR);
Won-Yong Lee, Daejeon (KR);
Chang-Soo Kim, Incheon (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 833 days.

(21) Appl. No.: 14/283,524

(22) Filed: May 21, 2014

(65) Prior Publication Data

US 2015/0278704 A1 Oct. 1, 2015

(30) Foreign Application Priority Data

Mar. 28, 2014 (KR) ........................ 10-2014-0036834

(51) Int. Cl.
*G06F 17/50* (2006.01)
*H01M 8/04992* (2016.01)
*H01M 8/04537* (2016.01)
*H01M 8/04664* (2016.01)
*H01M 8/1018* (2016.01)

(52) U.S. Cl.
CPC .... *G06F 17/5009* (2013.01); *H01M 8/04552* (2013.01); *H01M 8/04671* (2013.01); *H01M 8/04992* (2013.01); *H01M 2008/1095* (2013.01)

(58) Field of Classification Search
CPC ............... G06F 2217/16; G06F 1/1635; G06F 17/5009; H01M 8/04305; H01M 8/04537; H01M 8/04544; H01M 8/04701; H01M 8/04858; H01M 8/04865; H01M 8/22; H01M 2008/1095; H01M 8/04552; H01M 8/04671; H01M 8/04992
USPC .......................................................... 703/2
See application file for complete search history.

(56) References Cited

FOREIGN PATENT DOCUMENTS

KR 1020110033490 3/2011

OTHER PUBLICATIONS

O'Hayre et al. Fuel Cell Fundamentals, Book published by Jone Wiley & Sons, Inc., 2009, pp. 1-546.*

(Continued)

*Primary Examiner* — Omar F Fernandez Rivas
*Assistant Examiner* — Justin C Mikowski
(74) *Attorney, Agent, or Firm* — Cantor Colburn LLP

(57) ABSTRACT

Provided is a method for optimization of fuel cells operating conditions using a hybrid model, and more particularly, a method for optimization of fuel cells operating conditions using a hybrid model which generates a life prediction model determined by time and temperature based on a theoretical performance model and an empirical durability model and estimates an optimal operation temperature in a target life based on the life prediction model.

8 Claims, 18 Drawing Sheets

(56) References Cited

OTHER PUBLICATIONS

Suzuki et al. "Evaluation for sintering of electrocatalysts and its effect on voltage drops in high-temperature proton exchange membrane fuel cells (HT-PEMFC)", Internal Journal of Hydrogen Energy 37, Elsevier, Oct. 8, 2012, pp. 18272-18289.*
Ziogou et al. "Modeling, simulation and experimental validation of PEM fuel cell system", Computers and Chemical Engineering 35, Elsevier, Mar. 16, 2011, pp. 1866-1900.*
Barbir "PEM Fuel Cells: Theory and Practice", Elsevier Academic Press, Feb. 2005, pp. 1-426.*
Olapade "Study of the Morphological Properties of HT-PEMFC Components for Effective Membrane Hydration", Journal of The Electrochemical Society, 158 (6), Apr. 12, 2011, pp. B639-B649.*
Minjin Kim et al., Degradation Modeling and Lifetime Estimation for High Temperature Proton Exchange Membrane Fuel Cell Using PA Doped PBI Membrane, The 19th International Conference on Solid State Ionics, Jun. 2-7, 2013, Kyoto, Japan.
Minjin Kim et al., Lifetime Estimation based on a Degradation Model for High Temperature Proton Exchange Membrane Fuel Cell using PA doped PBI Membrane, Korean Woman's Leadership in Science & Engineering and Future, Aug. 22-24, 2013, Seoul, Korea.
Jintae Kim et al., modeling and optimization reflected the effect of temperature for high temperature PEM fuel cells, The Korea Society for Energy Engineering, May 23-May 24, 2013, Korea.
Jintae Kim et al., Degradation modeling and operational optimization for improving the lifetime of high-temperature PEM (proton exchange membrane) fuel cells, Energy, 2014, pp. 41-49.
Taegon Kang et al., Development of degradation model for predicting lifespan on a high temperature PEM fuel cells, The Korean Society for New and Renewable Energy, May 30-31, 2013, Korea.
Yuka Oono et al., Influence of operating temperature on cell performance and endurance of high temperature proton exchange membrane fuel cells, Journal of Power Sources, 2010, pp. 1007-1014.

* cited by examiner

METHOD FOR OPTIMIZATION OF FUEL CELLS OPERATING CONDITIONS USING HYBRID MODEL

CROSS-REFERENCE TO RELATED APPLICATIONS

This application claims priority under 35 U.S.C. § 119 to Korean Patent Application No. 10-2014-0036834, filed on Mar. 28, 2014, in the Korean Intellectual Property Office, the disclosure of which is incorporated herein by reference in its entirety.

TECHNICAL FIELD

The present invention relates to a method for optimization of fuel cells operating conditions using a hybrid model, and more particularly, to a method for optimization of fuel cells operating conditions using a hybrid model which generates a life prediction model determined by time and temperature based on a theoretical performance model and an empirical durability model and estimates an optimal operation temperature in a target life based on the life prediction model.

BACKGROUND

Fossil fuel reserves are very restricted, and thus the depletion of the fossil fuel is inevitable. In particular, since main emission sources of greenhouse gas causing global warming are fossil fuels, advanced countries have been focused on developing hydrogen energy, and the like, using alternative energy or atomic energy so as to decrease fossil fuels. An example of energy sources which have emerged as alternative energy may include solar energy, wind power generation, hydrogen energy, biomass, and the like. To use solar power or wind power, auxiliary facilities, such as a solar panel and a windmill, are required. However, since a wide space is required to install the solar panel or the windmill, other environmental problems, such as destruction of ecosystem and noise, may occur. Future energy needs requirements, such as environmental acceptability, economic productivity, and eternal capability.

A fuel cell is a cell which directly converts chemical energy generated by oxidation into electrical energy and is a new eco-friendly future energy technology of generating electrical energy from materials, which richly exist on earth, such as hydrogen and oxygen.

The fuel cell performs an electrochemical reaction in an electrolysis reverse reaction type of water by supplying oxygen to a cathode and hydrogen to an anode to produce electricity, heat, and water, thereby generating electrical energy at high efficiency without inducing pollutants.

The fuel cell which produces electricity and heat using fuel such as city gas is a representative new growth engine industry which has a greenhouse gas reduction effect and a very large job creation effect, and therefore is positively being promoted and commercialized around the world.

The fuel cell may generate electricity and hot water and save light and heat expenses of homes, and contribute to global warming prevention.

A proton-exchange membrane fuel cell (PEMFC) is an environmentally-friendly energy technology for high energy conversion efficiency, load following capability, and energy deficiency due to emission of low pollutants. However, a residential power generator (RPG) using the typical PEMFC is vulnerable to carbon monoxide (CO) poisoning and is difficult to manage water, and therefore a balance of plant (BOP) is excessively required. Therefore, a system is large and initial cost is high. Further, the temperature of hot water supplied from the system is low and the availability of a heat source is reduced. As a method for solving the problem of the existing system, a high temperature PEMFC using a polybenzimidazole (PBI) membrane with which phosphoric acid is doped has been receiving attention. The technology does not use water but uses phosphoric acid, as transfer media of hydrogen ions, and has an operation temperature range between 120° C. and 190° C. Therefore, since external humidification is not required and water is created in a vapor phase on a cathode electrode layer, the technology may solve a complicated water management problem. The high operation temperature extremely increases poisoning resistance of a catalyst layer against pollutants such as CO and therefore a fuel reforming process may be simplified. Further, a stack temperature has a large temperature difference from external environment, such that cooling may be effectively performed, a high temperature heat source may be collected to increase heat availability, and performance and durability may be largely affected by operating conditions. Nevertheless, it is confirmed that a research period of the high temperature PEMFC is shorter than that of the typical PEMFC and therefore research cases of performance and durability depending on the operating conditions are very small and the operating conditions largely affect the performance and durability. However, the optimal operating conditions are not yet proposed.

Therefore, to maximize the performance and durability, a research for the optimization of the operating conditions has been required.

Korean Patent Laid-Open Publication No. 10-2011-0033490 discloses a method of operating a polymer electrolyte membrane fuel cell.

RELATED ART DOCUMENT

Patent Document

Korean Patent Laid-Open Publication No. 10-2011-0033490

SUMMARY

An exemplary embodiment of the present invention is directed to generating a life prediction model (hybrid model) determined by time and temperature based on a theoretical performance model which is generated based on a potential difference depending on a current density of a cell and an empirical durability model which is generated based on a long-term durability test and deriving an optimal operation temperature in a target life based on the life prediction model.

In one general aspect, there is provided a method for optimization of fuel cells operating conditions using a hybrid model, including: generating a theoretical performance model by obtaining a potential difference depending on a current density of a cell based on a thermodynamics reversible voltage, an activity loss, a resistance loss, and a concentration loss of a high temperature proton-exchange membrane fuel cell (PEMFC) which is based on a polybenzimidazole (PBI) membrane with which phosphoric acid is doped (S10); generating an empirical durability model by performing a long-term durability test which is performed for a predetermined period under experimental conditions (operating conditions) specifying the high temperature PEMFC based on the PBI membrane with which the phosphoric acid is doped, so as to predict a reduction in cell voltage over an operation time at a predetermined temperature (S20); generating a life prediction model determined by time and temperature based on the performance model generated in the generating of the theoretical performance model (S10) and the durability model generated in the generating of the empirical durability model (S20) (S30); and estimating an optimal operation temperature at a target life based on the life prediction model generated in the generating of the life prediction model (S30) (S40).

In the generating of the performance model (S10), the potential difference depending on a current density of the cell may be obtained by subtracting the activity loss ($\eta_{act}$), the resistance loss ($\eta_{ohm}$), and the concentration loss ($\eta_{conc}$) from a thermodynamics reversible voltage ($E_{rev}$) based on the following Equation.

$$E_{cell} = E_{rev} - \eta_{act} - \eta_{ohm} - \eta_{conc}$$

The thermodynamics reversible voltage may be calculated based on the following Equation, $$E^{ref} = -\frac{\Delta g_{mx}^{ref}}{nF}$$

(In the above Equation, $\Delta g_{mx}^{ref}$ represents Gibbs' free energy and F represents a Faraday constant and n represents number of transfer electrons)

the thermodynamics reversible voltage at a given temperature T may be calculated based on the following Equation by introducing a change in entropy depending on temperature, $$E_T = E^{ref} + \frac{\Delta s}{nF}(T - T_{ref})$$

(In the above Equation, $\Delta s$ represents the change in entropy depending on the temperature and $T_{ref}$ represents reference temperature)

when a concentration of chemical species is specified, the thermodynamics reversible voltage may be calculated based on the following Equation by introducing activity, and $$E_{rev} = E^{ref} - \frac{RT}{nF}\ln\frac{a_{H_2O}}{a_{H_2}a_{O_2}^{0.5}}$$

(In the above Equation, R represents an abnormal gas constant and a represents activity)

at the given temperature T and concentration c, the thermodynamics reversible voltage may be calculated based on the following Equation.

$$E_{rev} = E^{ref} + \frac{\Delta s}{nF}(T - T_{ref}) - \frac{RT}{nF}\ln\frac{a_{H_2O}}{a_{H_2}a_{O_2}^{0.5}}$$

The activity loss may be calculated by the following Equation.

$$j_{gross} = j_0(e^{\alpha n P \eta_c/RT} - e^{-(1-\alpha)nP\eta_c/RT})$$

$$j_{gross} = j_0 e^{\alpha n P \eta_c/RT}$$

$$\eta_c = \frac{RT}{\alpha nF}\ln\frac{j + j_{leak}}{j_0}$$

$$j_0 = j_0^{ref} S_{Pt}^{eff}\left(\frac{c_{O_2}}{c_{O_2}^{ref}}\right)^\gamma e^{-\frac{\Delta b_{act}}{RT}\left(1 - \frac{T}{T^{ref}}\right)}$$

(In the above Equation, n represents number of transfer electrons and α represents a transfer coefficient, a total of current density $j_{gross}$ includes an operating current density j, an internal current, and a loss current $j_{leak}$ occurring due to a leakage of reactants, by being focused on a high current density area in which a reverse reaction is disregarded, a second exponential term of the right terms representing the reverse reaction is disregarded, an exchange current density $j_0^{ref}$ is corrected depending on a concentration and a temperature value, a reference exchange current density $j_0^{ref}$ is measured based on a reference temperature $T^{ref}$ and a reference oxygen concentration $c_{O_2}^{ref}$, $S_{Pt}^{eff}$ represents an effective platinum surface area, $c_{O_2}$ represents an oxygen concentration in the catalyst layer, and γ represents a reaction order, $j_0^{ref}$ and $S_{Pt}^{eff}$ are estimated based on the experimental data, and an activity barrier energy $\Delta b_{act}$ uses 7.24.104 Jmol$^{-1}$.)

The resistance loss may be represented by the following Equation.

$$\eta_{ohm} = j\frac{\delta_m}{\kappa_m}$$

$$\kappa_m = \frac{AB}{T}e^{-\frac{b_{act}}{RT}}$$

$$b_{act} = -619.6DL + 21750$$

$$A = 168DL^3 - 6324DL^2 + 65750DL + 8460$$

$$B = 1 + (0.1432T - 56.89)RH^{eff}$$

(In the above Equation, $\delta_m$ and $k_m$ each represent the thickness and ion conductivity of the membrane, the ion conductivity of the PBI membrane relies on a doping level (DL) of the phosphoric acid, relative humidity (RH), and temperature T, temperature dependency of ion conductivity relies on an Arrhenius law, A and B are pre-exponential coefficients describing an effect of the phosphoric acid doping level and the relative humidity, respectively, $b_{act}$ represents the activation energy of the membrane.

The generating of the durability model (S20) may include: generating a draft model predicting the reduction in cell voltage over the operation time at the predetermined various temperatures while ruling out an effect of the operation time (S21); estimating each coefficient of the draft model over various times generated in the generating of the draft model (S21) based on a function depending on the temperature (S22); and generating a third-order non-linear function depending on the operation time and temperature using each coefficient estimated in the estimating of the coefficient (S22) (S23).

For each of the predetermined various temperatures, the draft model in the generating of the draft model (S21) may predict the reduction in cell voltage over the operation time using the draft model corresponding to the following Equation, and $$VD(t)=x_1t^3-x_2t^2+x_3t+x_4 \quad 5$$

(the draft models are configured of four coefficients of third-order, second-order, first-order coefficients, and a constant)

the final model may be to fit the four coefficients $x_1$, $x_2$, $x_3$ and $x_4$ of the draft model depending on the operation temperature.

In the generating of the draft model (S21), a pretreatment process of converting each coefficient into a log value prior to fitting may be performed to improve a prediction ability of the draft model.

In the estimating of the operating condition (S40), when the target life is maximal, the operation temperature may be kept at 150 to 160° C.

DETAILED DESCRIPTION OF MAIN ELEMENTS

Figure 1:
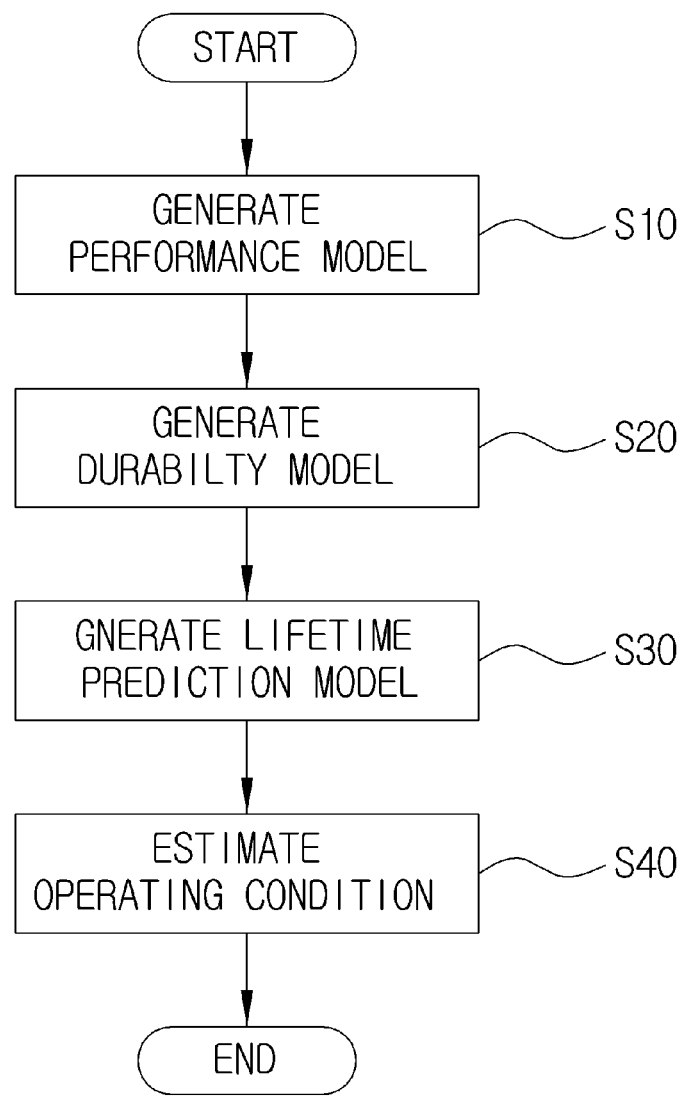
FIG. 1 is a conceptual diagram of a method for optimization of fuel cells operating conditions using a hybrid model according to an exemplary embodiment of the present invention.

S10: GENERATE PERFORMANCE MODEL
S20: GENERATE DURABILITY MODEL
S21: GENERATE DRAFT MODEL
S22: ESTIMATE COEFFICIENT
S23: GENERATE NON-LINEAR FUNCTION
S30: GENERATE LIFE PREDICTION MODEL
S40: ESTIMATE OPERATING CONDITION

DETAILED DESCRIPTION OF EMBODIMENTS

Hereinafter, exemplary embodiments of the present invention will be described with reference to the accompanying drawings. The drawings to be provided below are provided by way of example so that the idea of the present invention can be sufficiently transferred to those skilled in the art to which the present invention pertains. Therefore, the present invention is not be limited to the drawings provided below but may be modified in many different forms. In addition, throughout the specification, like reference numerals denotes like components. It is to be noted that the same components are denoted by the same reference numerals throughout the drawings, if possible. Technical terms and scientific terms used in the present specification have the general meaning understood by those skilled in the art to which the present invention pertains unless otherwise defined, and a description for the known function and configuration obscuring the present invention will be omitted in the following description and the accompanying drawings.

Figure 2:
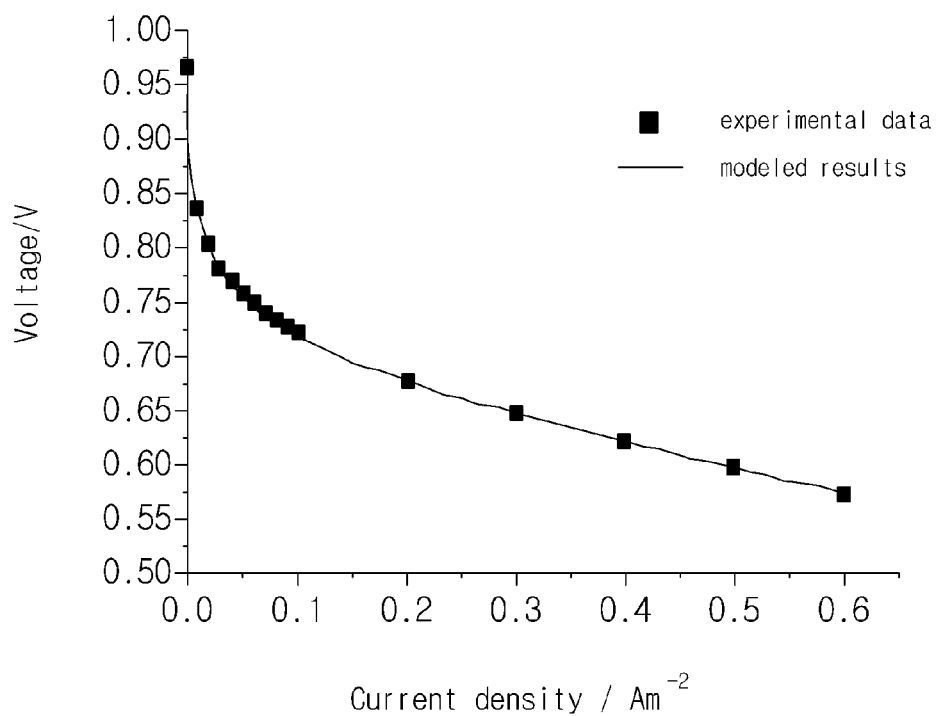
FIG. 2 is a graph illustrating experimental data of a reference case.
Figure 3:
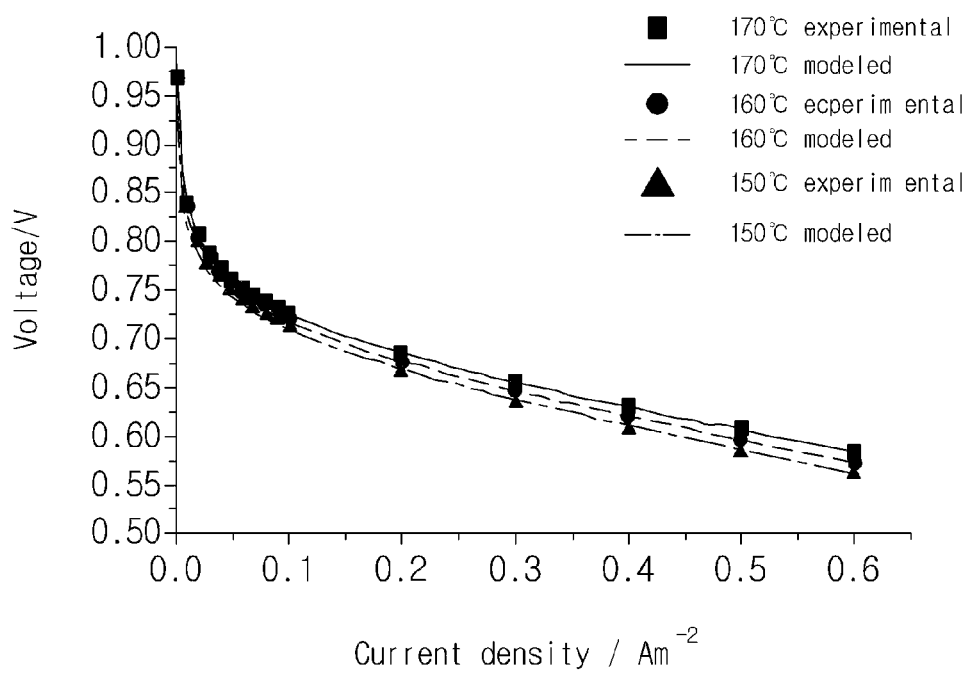
FIG. 3 is a graph illustrating a comparison result of a performance prediction result with experimental data depending on a change in cell temperature when an oxygen concentration is constant at 20%.
Figure 4:
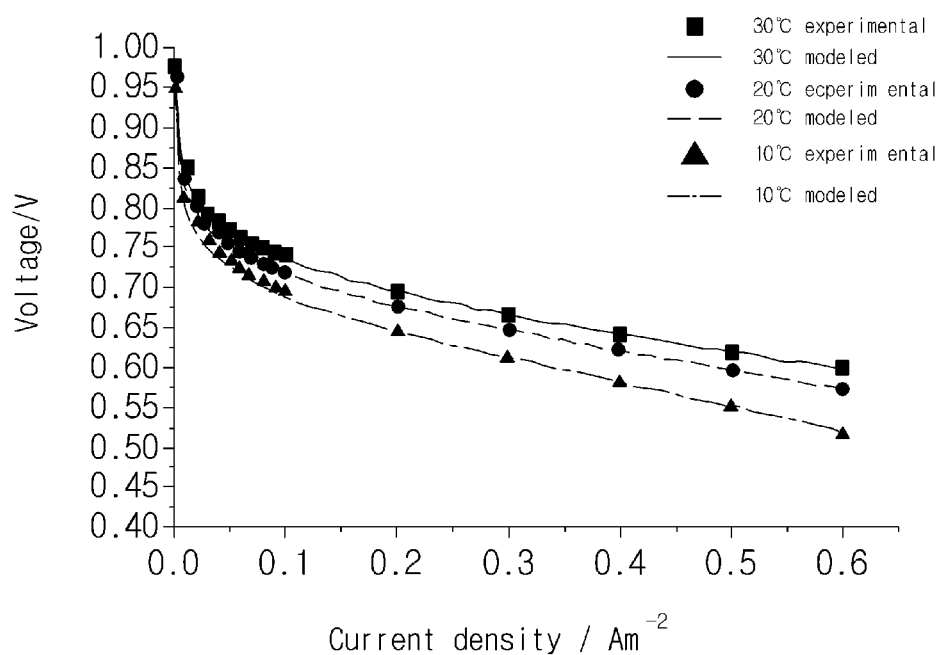
FIG. 4 is a graph illustrating a comparison result of experimental data with a model result depending on the oxygen concentration when an operation temperature is constant at 160° C.
Figure 5:
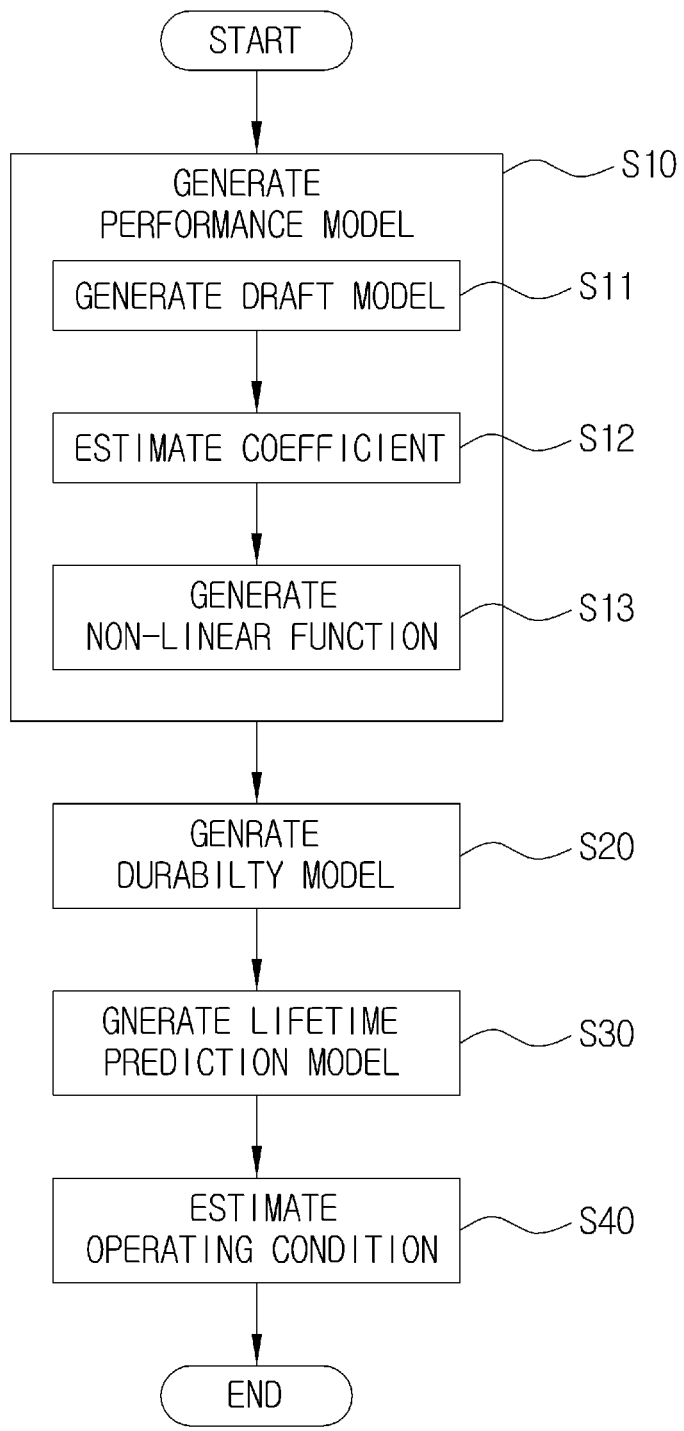
FIG. 5 is a detailed conceptual diagram of a process of generating a performance model of the method for optimization of fuel cells operating conditions using a hybrid model according to the exemplary embodiment of the present invention.
Figure 6:
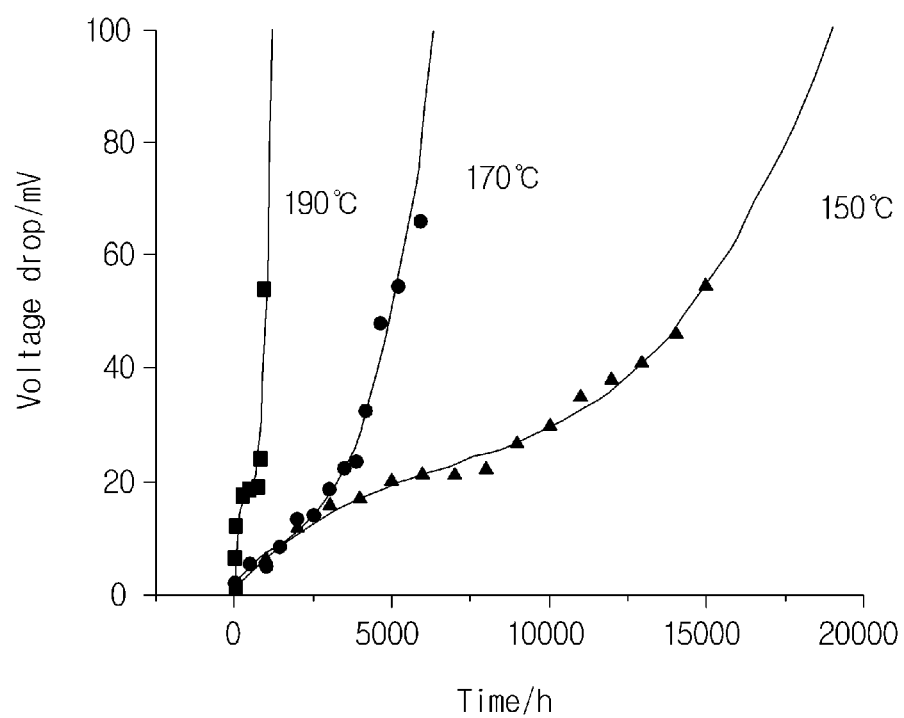
FIG. 6 is a graph illustrating a cell voltage drop value over time estimated by a draft model.
Figure 7A:
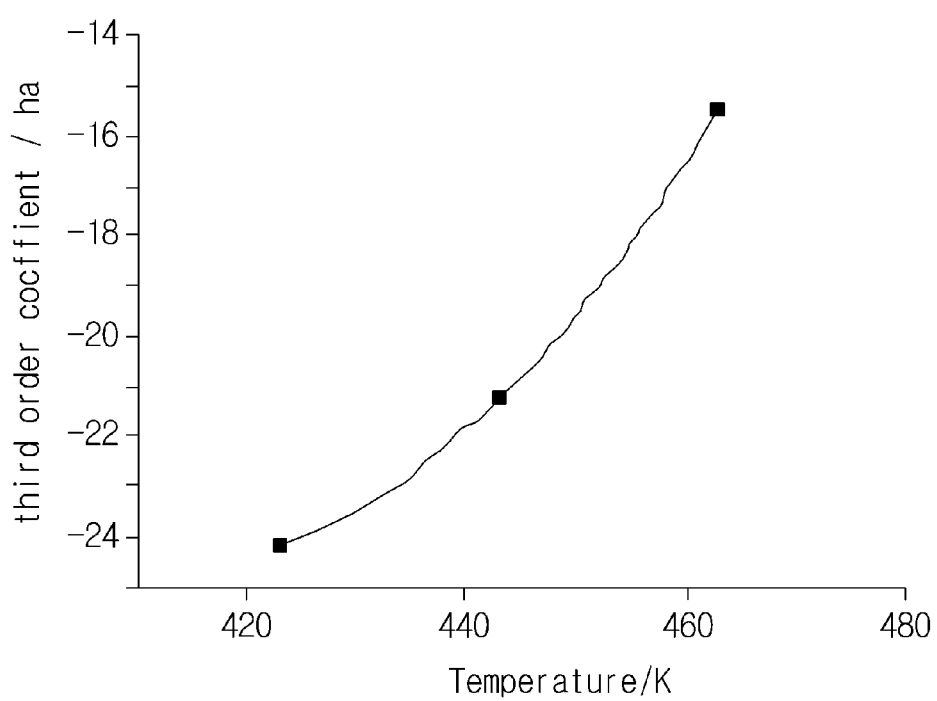
FIGS. 7A to 7D are graphs illustrating a result obtained by fitting each coefficient of a third-order polynomial depending on an operation temperature.
Figure 7B:
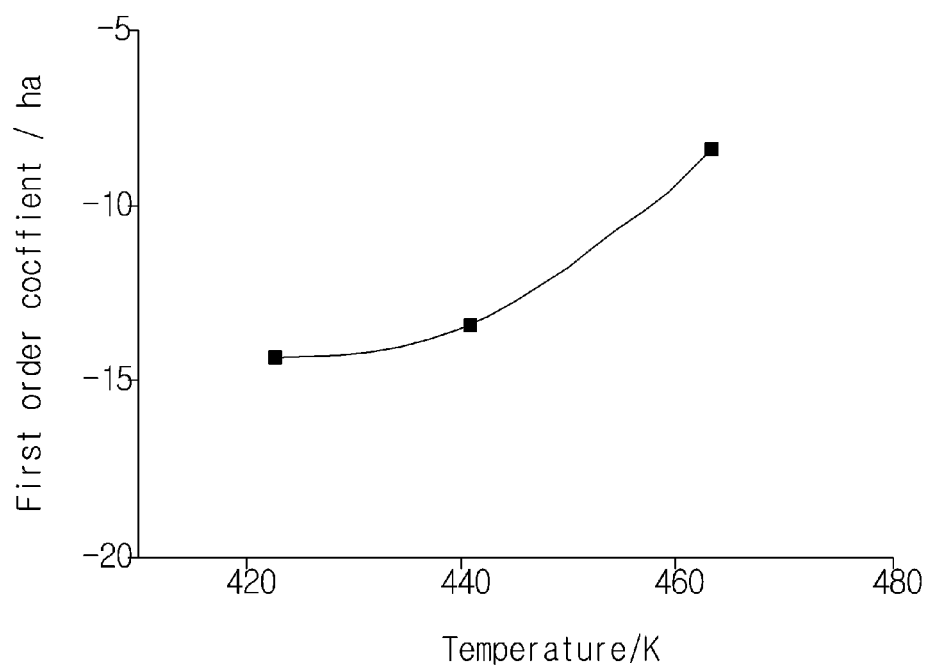
Figure 7C:
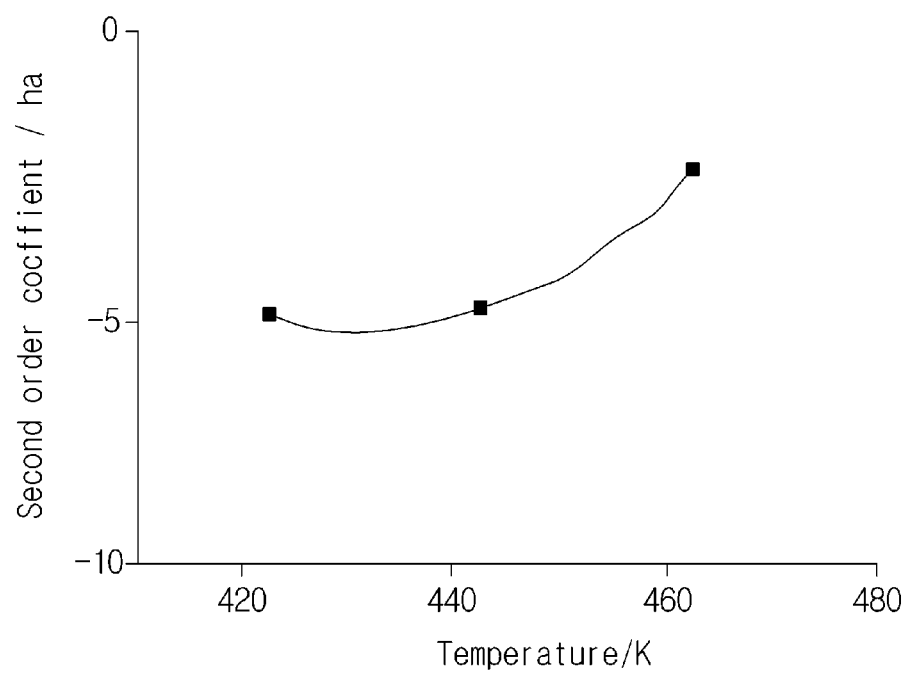
Figure 7D:
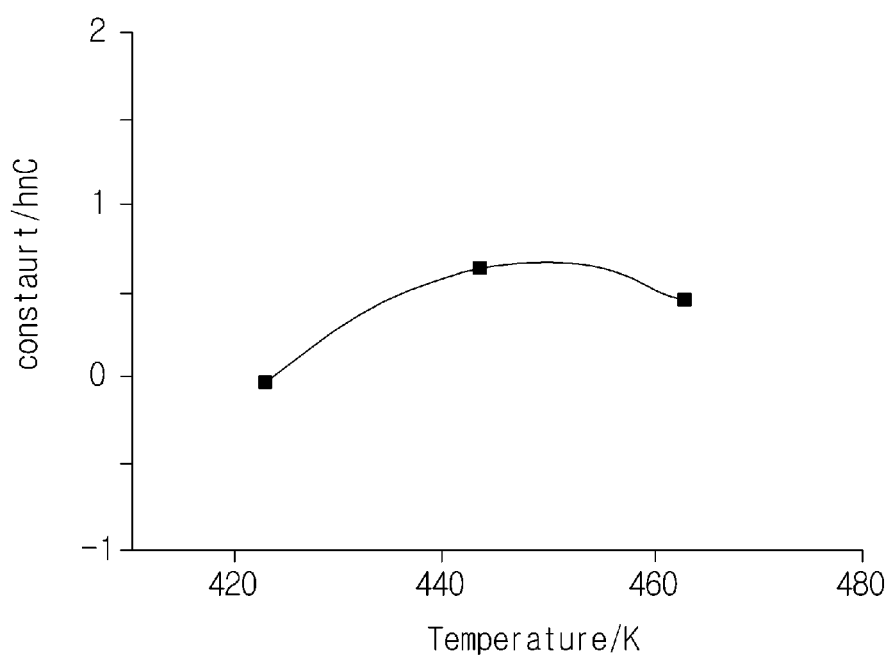
Figure 8A:
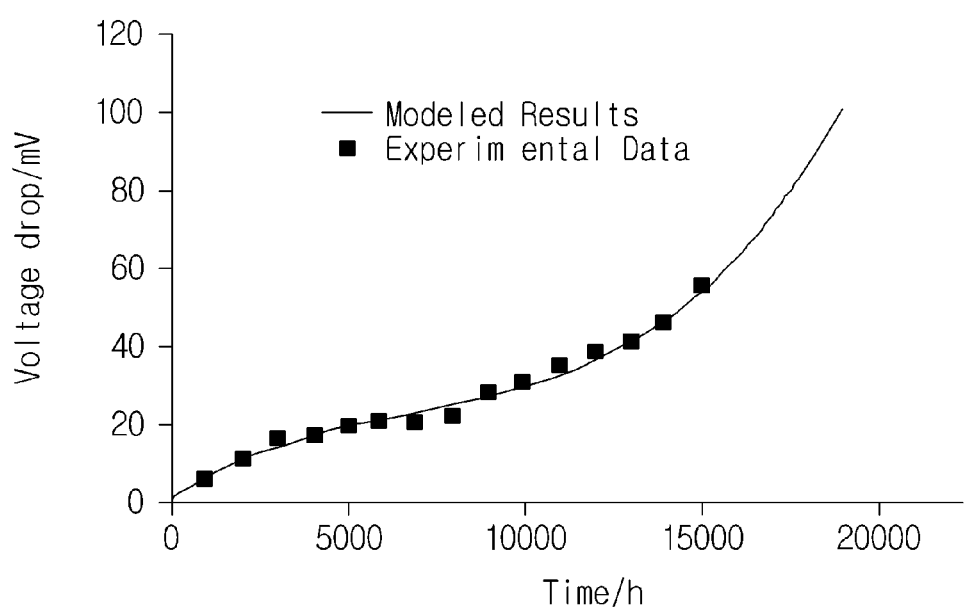
FIGS. 8A to 8C are graphs illustrating a comparison result of a durability prediction result with experimental data depending on temperature and time.
Figure 8B:
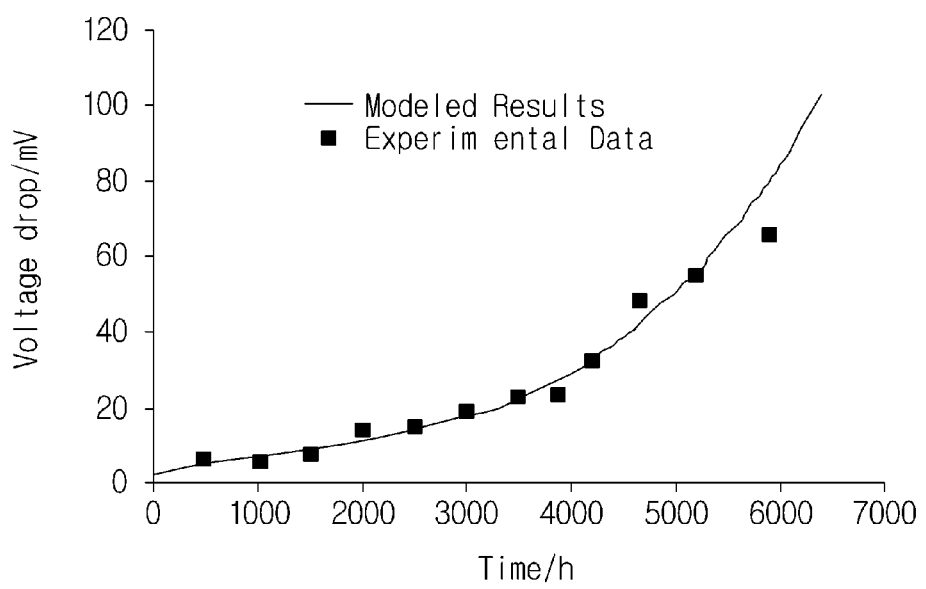
Figure 8C:
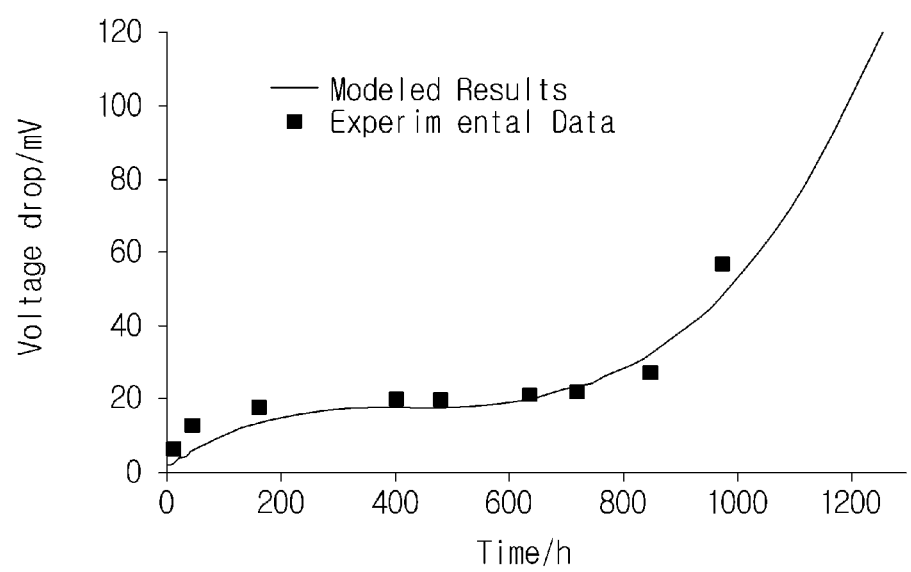
Figure 9:
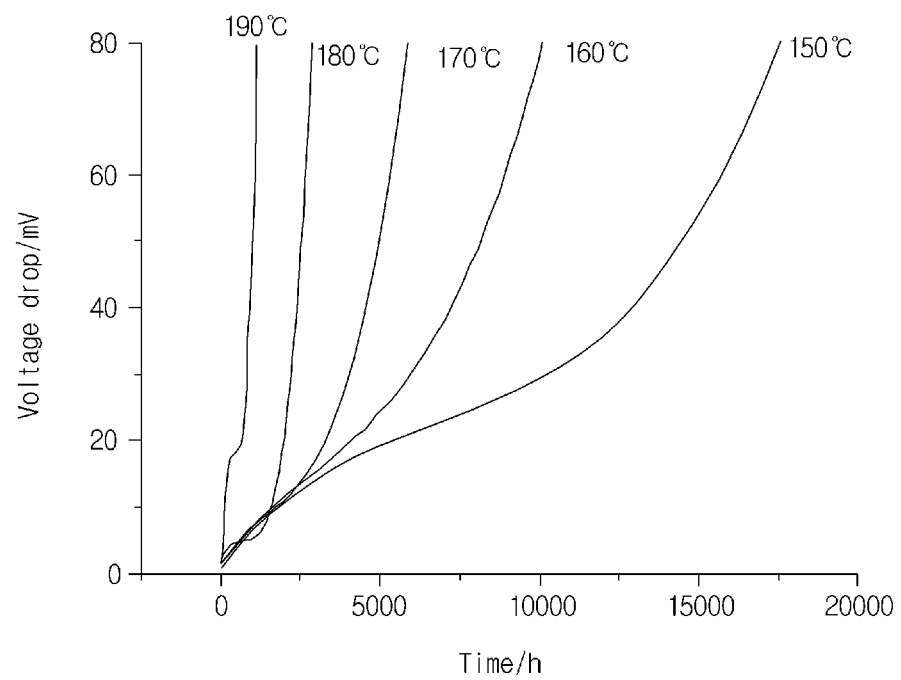
FIG. 9 is a graph illustrating a voltage reduction prediction result at various temperatures.
Figure 10:
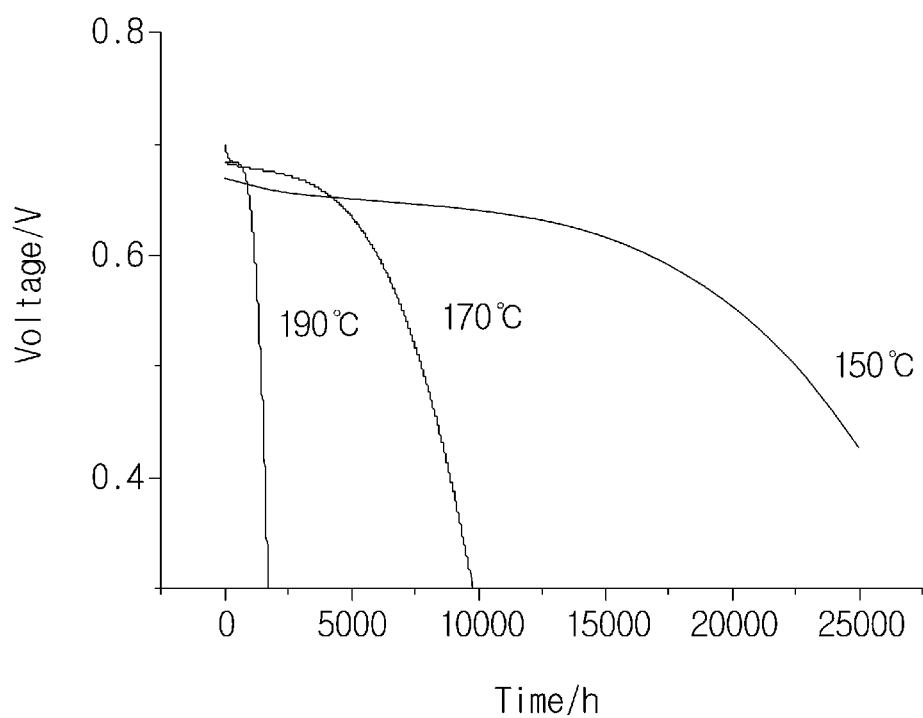
FIG. 10 is a graph illustrating cell performance over time at various temperatures at 0.2 $Acm^{-2}$.
Figure 11:
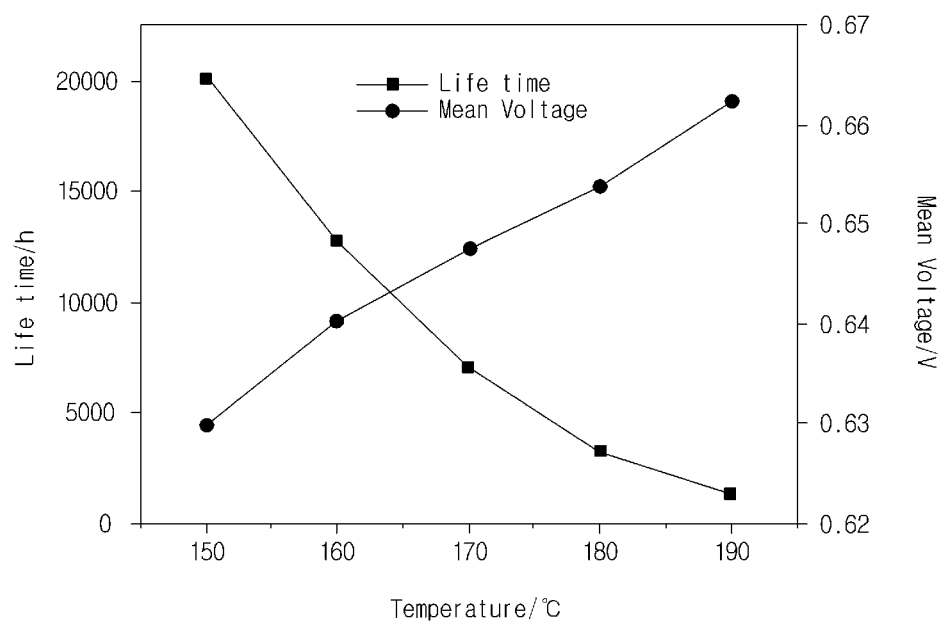
FIG. 11 is a graph illustrating life depending on each temperature and mean performance during life.
Figure 12:
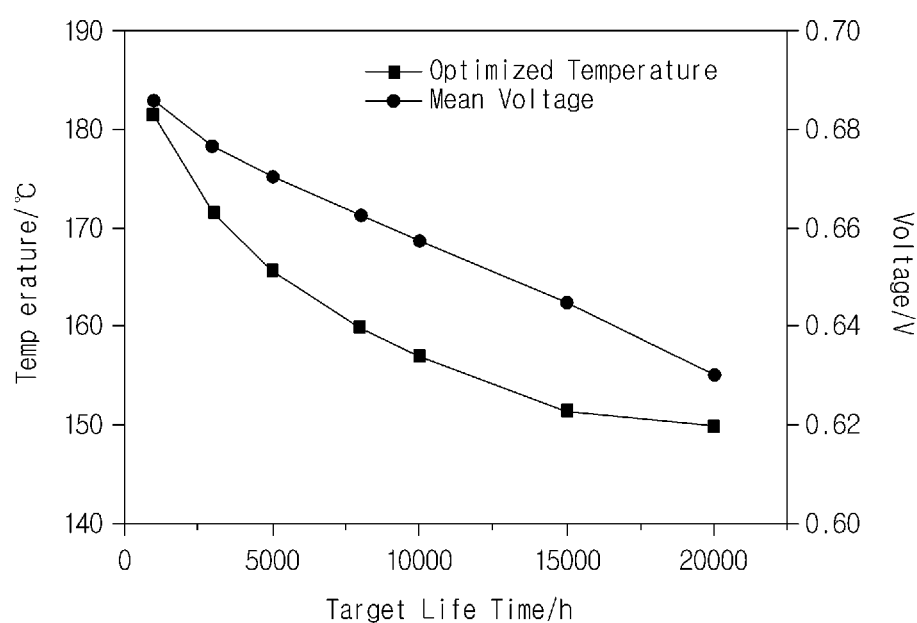
FIG. 12 is a graph illustrating an optimal operation temperature and a mean cell voltage over a target operation time.
Figure 13:
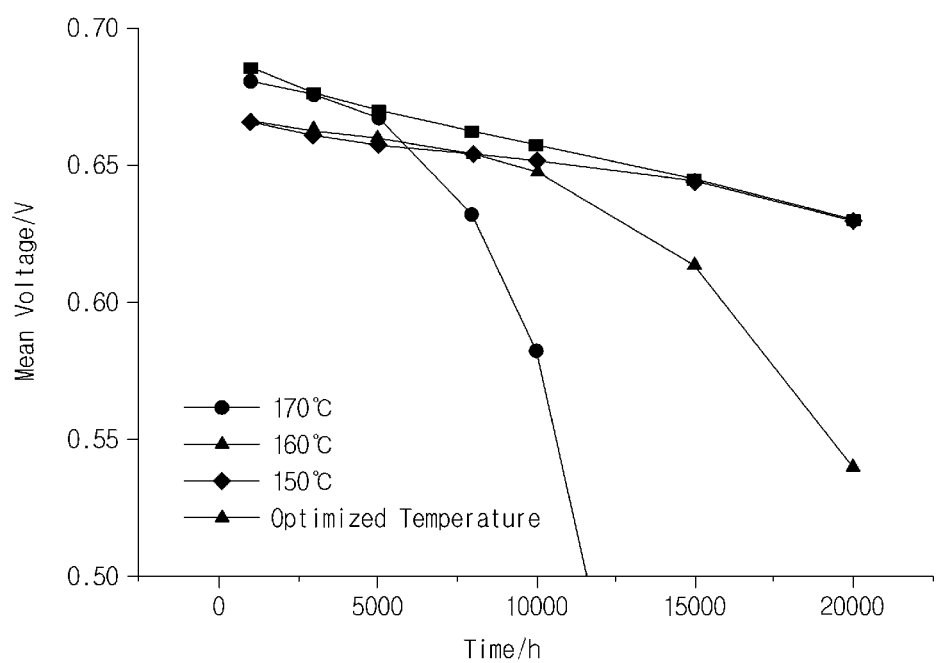
FIG. 13 is a graph illustrating a mean performance prediction value over time when an operation is performed at 150, 160, 170° C., and an optimal operation temperature.

FIG. 1 is a conceptual diagram of a method for optimization of fuel cells operating conditions using a hybrid model according to an exemplary embodiment of the present invention, FIG. 2 is a graph illustrating experimental data of a reference case, FIG. 3 is a graph illustrating a comparison result of a performance prediction result with experimental data depending on a change in cell temperature when an oxygen concentration is constant at 20%, FIG. 4 is a graph illustrating a comparison result of experimental data with a model result depending on the oxygen concentration when an operation temperature is constant at 160° C., FIG. 5 is a detailed conceptual diagram of a process of generating a performance model of the method for optimization of fuel cells operating conditions using a hybrid model according to the exemplary embodiment of the present invention, FIG. 6 is a graph illustrating a cell voltage drop value over time estimated by a draft model, FIGS. 7A to 7D are graphs illustrating a result obtained by fitting each coefficient of a third-order polynomial depending on an operation temperature, FIGS. 8A to 8C are graphs illustrating a comparison result of a durability prediction result with experimental data depending on temperature and time, FIG. 9 is a graph illustrating a voltage reduction prediction result at various temperatures, FIG. 10 is a graph illustrating cell performance over time at various temperatures at 0.2 $Acm^{-2}$, FIG. 11 is a graph illustrating life depending on each temperature and mean performance during life, FIG. 12 is a graph illustrating an optimal operation temperature and a mean cell voltage over a target operation time, and FIG. 13 is a graph illustrating a mean performance prediction value over time when an operation is performed at 150, 160, 170° C., and an optimal operation temperature.

As illustrated in FIG. 1, the method for optimization of fuel cells operating conditions using a hybrid model according to an exemplary embodiment of the present invention includes generating a performance model (S10), generating a durability model (S20), generating a life prediction model (S30), and estimating an operating condition (S40).

In the generating of the performance model (S10), a potential difference depending on a current density of a cell is obtained based on a thermodynamics reversible voltage, an activity loss, a resistance loss, and a concentration loss of a high temperature proton-exchange membrane fuel cell (PEMFC) which is based on a polybenzimidazole (PBI) membrane with which phosphoric acid is doped and a theoretical performance model is generated based on the obtained potential difference.

In more detail, to predict the high temperature PEMFC based on the PBI with which the phosphoric acid is doped, the theoretical performance model which is a one-dimensional non-isothermal model is generated.

A design domain of the theoretical performance model may be configured of a plurality of layers, including a catalyst layer, a gas diffusion layer, a gas channel, and the PBI membrane between an anode and a cathode and the theoretical performance model may be assumed as follows.

The operating condition is in a normal state.
All reactants are abnormal gas and water is present only in a gas state.
Interfacial resistance and electric resistance are disregarded.
Water movement through the membrane is not present.
Activity overvoltage of the anode is disregarded.
A thickness of the catalyst layer is disregarded.
The diffusion layer is homogeneous.

In this case, it is preferable to supply pure hydrogen and air to the anode and the cathode, respectively.

Various physical and electrochemical phenomena which occur during the oxidation and reduction reaction may be reflected to each electrode of a fuel cell.

In the generating of the durability model (S20), to predict the reduction in cell voltage over the operation time at a predetermined temperature, the empirical durability model is generated by performing the long-term durability test which is performed for a predetermined period under the experimental conditions (operating conditions) specifying the high temperature PEMFC based on the PBI membrane with which the phosphoric acid is doped.

The durability test experiment imparts poor environment and conditions to a subject of experiment to be divided into a severe condition test which is performed over a short period of time and a long-term test which is performed over a long period of time under a specific experimental condition.

The severe condition test may observe results over a relatively short period of time but may not appreciate performance and durability results under the specific operating condition required to derive the optimal operating condition or the long-term test may derive the optimal specific operating condition using the performance and durability results under the specific operating condition.

For example, an experiment is prepared to control values corresponding to factors and measure characteristic values, based on a membrane electrode assembly (MEA) including the polybenzimidazole (PBI) membrane with which the phosphoric acid is doped and a carbon fiber gas diffusion electrode (GDE).

Next, a cell may be heated from room temperature to set temperature for a predetermined time. Herein, the cell may be purged with nitrogen from predetermined temperature to the set temperature. To extract the normal performance of the first operating cell, the cell is subjected to the activation process and is purged with nitrogen for a predetermined temperature period, thereby obtaining more accurately experimental results.

Next, dry hydrogen and dry air which are heated up to the cell operation temperature by a line heater in a hydrogen and oxygen supply pipe are supplied to an anode and a cathode, respectively and a predetermined current density is constantly applied into the cell for a predetermined time.

For example, the cell is heated up to 160° C. at normal temperature for about 1 hour and is purged with nitrogen from the cell temperature of 80° C. to 160° C. and when the cell temperature is 160° C., the dry air having a stoichiometric ratio ($\lambda$) of 1.6 heated to the cell operation temperature and the dry air having a stoichiometric ratio ($\lambda$) of 2.5 which are heated by the line heater in the supply pipe are supplied to the anode and the cathode, respectively and the current density of 0.2 Acm$^{-2}$ may be constantly applied for 100 hours.

In other words, external factors affecting the experimental results are minimized and thus high reliable experimental results may be obtained.

In the generating of the life prediction model (S30), the life prediction model determined by the time and temperature based on the performance model generated in the generating of the performance model (S10) and the durability model generated in the generating of the durability model (S20) is generated.

In the estimating of the operating condition (S40), the optimal operation temperature in the target life is estimated based on the life prediction model generated in the generating of the life prediction model (S30).

That is, according to the method for optimization of fuel cells operating conditions using a hybrid model, the life prediction model (hybrid model) determined by the time and temperature based on the theoretical performance model and the empirical durability model is generated and thus the optimal operation temperature in the target life may be derived.

The generating of the performance model (S10) will be described in more detail.

In the generating of the performance model (S10), the potential difference depending on the current density of the cell may be obtained by subtracting the activity loss ($\eta_{act}$), the resistance loss ($\eta_{ohm}$), the concentration loss ($\eta_{conc}$) from the thermodynamics reversible voltage ($E_{rev}$) based on the following Equation.

$$E_{cell} = E_{rev} - \eta_{act} - \eta_{ohm} - \eta_{conc}$$

Here, the concentration loss effect may be reflected to the activity loss and the reversible voltage, respectively.

That is, the potential difference depending on the current density of the cell is obtained by subtracting the activity loss, the resistance loss, and the concentration loss from the thermodynamics reversible voltage, thereby deriving the more reliable theoretical performance model.

In this case, the thermodynamics reversible voltage is calculated based on the following Equation.

$$E^{ref} = -\frac{\Delta g_{rnx}^{ref}}{nF}$$

(In the above Equation, $\Delta g_{rnx}^{ref}$ represents Gibbs' free energy and F represents a Faraday constant and n represents number of transfer electrons)

The thermodynamics reversible voltage at a given temperature T is calculated based on the following Equation by introducing a change in entropy depending on temperature.

$$E_T = E^{ref} + \frac{\Delta s}{nF}(T - T_{ref})$$

(In the above Equation, Δs represents the change in entropy depending on the temperature and $T_{ref}$ represents reference temperature)

When a concentration of chemical species is specified, the thermodynamics reversible voltage is calculated based on the following Equation by introducing activity.

$$E_{rev} = E^{ref} - \frac{RT}{nF}\ln\frac{a_{H_2O}}{a_{H_2}a_{O_2}^{0.5}}$$

At the given temperature T and concentration c, the thermodynamics reversible voltage is calculated based on the following Equation.

$$E_{rev} = E^{ref} + \frac{\Delta s}{nF}(T - T_{ref}) - \frac{RT}{nF}\ln\frac{a_{H_2O}}{a_{H_2}a_{O_2}^{0.5}}$$

Further, the activity loss may be represented by the following Equation.

$$j_{gross} = j_0(e^{\alpha nP\eta_c/RT} - e^{-(1-\alpha)nP\eta_c/RT})$$

(In the above Equation, α represents a transfer coefficient, a total of current density $j_{gross}$ includes an operating current density j, an internal current, and a loss current $j_{leak}$ occurring due to a leakage of reactants)

By being focused on the high current density area in which the reverse reaction may be disregarded, a second exponential term of the right terms representing the reverse reaction may be disregarded like the following Equation.

$$j_{gross} = j_0 e^{\alpha nP\eta_c/RT}$$

An exchange current density $j_0^{ref}$ from $$\eta_{act} = \frac{RT}{\alpha nF}\ln\frac{j + j_{leak}}{j_0}$$

may be corrected depending on the concentration and temperature value based on the following Equation.

$$j_0 = j_0^{ref} S_{Pt}^{eff}\left(\frac{c_{O_2}}{c_{O_2}^{ref}}\right)^{\gamma} e^{-\frac{\Delta b_{act}}{RT}\left(1-\frac{T}{T^{ref}}\right)}$$

(A reference exchange current density $j_0^{ref}$ is measured based on a reference temperature $T^{ref}$ and a reference oxygen concentration $c_{O_2}^{ref}$. $S_{Pt}^{eff}$ represents an effective platinum surface area, $c_{O_2}$ represents an oxygen concentration in the catalyst layer, and γ represents a reaction order. $j_0^{ref}$ and $S_{Pt}^{eff}$ are estimated based on the experimental data. The activity barrier energy $\Delta b_{act}$ uses $7.24 \cdot 10^4$ Jmol$^{-1}$)

The activity loss is calculated based on the above Equations.

Further, the resistance loss may be represented by the following Equation.

$$\eta_{ohm} = j\frac{\delta_m}{\kappa_m}$$

(In the above Equation, $\delta_m$ and $k_m$ each represent the thickness and ion conductivity of the membrane)

The ion conductivity of the PBI membrane relies on a doping level (DL) of the phosphoric acid, relative humidity (RH), and temperature T. The temperature dependency of the ion conductivity may be represented by the following Equation.

$$\kappa_m = \frac{AB}{T}e^{-\frac{b_{act}}{RT}}$$

(A and B are pre-exponential coefficients describing an effect of the phosphoric acid doping level and the relative humidity, respectively. $b_{act}$ represents the activation energy of the membrane)

When the activation energy of the membrane uses Equation $b_{act} = -619.6DL + 21750$, the A and B may be derived from the following Equations.

$$A = 168DL^3 - 6324DL^2 + 65750DL + 8460$$

$$B = 1 + (0.1432T - 56.89)RH^{eff}$$

The resistance loss is calculated based on the above Equations.

To confirm the reliability of the theoretical performance model as described above, the following experiment is performed.

Pure dry hydrogen having a stoichiometric ratio of 1.6 and a mixing oxidizer having a stoichiometric ratio of 2.5 are each supplied to the anode and the cathode, respectively. The supply temperature of the reactants is equal to the cell temperature and the local temperature difference in the cell is disregarded. A geometrical size of the model is shown in Table 1 and physical characteristics are shown in Table 2. Table 2 includes values of α, DL, $j_0^{ref}$, $j_{leak}$ and which are estimated based on the experimental data.

TABLE 1

| Parameter | Value |
| --- | --- |
| Channel length | 4.2 10$^{-1}$ m |
| Channel width | 1.1 10$^{-3}$ m |
| Channel depth | 8.0 10$^{-4}$ m |
| GDL thickness | 3.0 10$^{-4}$ m |
| Membrane thickness | 5.0 10$^{-5}$ m |
| Activated area | 2.5 10$^{-3}$ m |

TABLE 2

| Physical Properties | Value |
| --- | --- |
| Standard state free energy change, Δ grxn | −237,000 J mol$^{-1}$ |
| Entrophy change for reaction, Δ s | −44.43 J mol$^{-1}$K$^{-1}$ |
| Faraday constant, F | 96,485 C mol$^{-1}$ |
| Gas constant, R | 8.314 J mol$^{-1}$K$^{-1}$ |
| Effective diffusivity of hydrogen, $D_{H_2}^{eff}$ | 1.490 10$^{-5}$ m$^2$s$^{-1}$ |
| Effective diffusivity of oxygen, $D_{O_2}^{eff}$ | 2.950 10$^{-6}$ m$^2$s$^{-1}$ |
| Stoichiometry of anode gas, $\lambda_a$ | 1.6 |
| Stoichiometry of cathode gas, $\lambda_c$ | 2.0 |
| anode/cathode pressure, p | 1.08/1.14 atm |
| Leak current density, jleak | 5.0 10$^{-4}$ Acm$^{-2}$ |
| Transfer coefficient, α | 0.2 |

TABLE 2-continued

| Physical Properties | Value |
| --- | --- |
| Reference exchange current density, | 5.38 $10^{-6}$ Acm$^{-2}$ |
| Doping level, DL | 28 |

As the reference case, the experiment was made by supplying pure hydrogen and an oxidizer having oxygen concentration of 20% at 160° C. at an atmospheric pressure. FIG. 2 illustrates a comparison result of the experimental data of the reference case with a model prediction polarization curve. It may be confirmed from FIG. 2 that the experimental data coincide with the model prediction result very well. In particular, generally, a model at 0.2 Acm$^{-2}$ at which a stationary high temperature PEMFC system is operated is predicted very well. An open circuit voltage is 4 mV higher than the experimental data and an absolute deviation is under 1 mV. At 0.1 Acm$^{-2}$ or less, a voltage is suddenly reduced due to the activity loss of the cathode, and at 0.1 Acm$^{-2}$ or more, as the current density due to the resistance loss is increased, the voltage is linearly reduced. The concentration loss effect is not observed up to 0.6 Acm$^{-2}$.

When the oxygen concentration is constant at 20%, the comparison of the performance prediction result with the experimental data depending on the change in cell temperature was illustrated in FIG. 3. The model prediction result coincides with the experimental data very well. As illustrated in FIG. 3, at 0.2 Acm$^{-2}$, the cell performance depending on the temperature was 0.669, 0.677, and 0.685 and the prediction accuracy was 99.4%. At 0.6 Acm$^{-2}$, the cell performance depending on the temperature was 0.561, 0.573, and 0.584 and the prediction accuracy was 99.82%. The effect of the activity overvoltage was shown to be relatively small, when comparing the voltage change depending on the temperature with the experimental data in the dominant low current density area. Further, it may be observed that the voltage reduction ratio depending on the current density may be slowly reduced as the current density is increased. The reason is that as the current density is increased and thus the reaction amount is increased, the water generation amount is increased and thus the relative humidity of the catalyst layer is increased, such that the mobility of the phosphoric acid within the PBI conductor may be improved and the ion conductivity may be improved.

When the operation temperature is increased from 150° C. to 190° C., the performance at 2000 Am$^{-2}$ is increased by 16 mV from 0.669 V to 0.685 V and the effect at the high current density was shown to be more remarkable. (The performance difference over the temperature at the 2000 Am$^{-2}$ is 23 mV) the change in durability rate depending on the change in operation temperature was shown to be more remarkable than the change in performance depending on the temperature change. When the life limit performance reference is set to be 0.55V, if the operation temperature is reduced from 190 to 150° C., it might be confirmed that the cell life is remarkably increased as much as about 15 times.

For the long-term operation for about 20,000 hours, when the cell needs to be operated at low temperature and the life is not required as much, it is preferable that performing the operation at the higher temperature improves the performance. Further, it might be confirmed that operating the high temperature PEMFC at any set temperature may have an adverse effect on the overall performance and life and the durability problem which is the largest issue in the high temperature PEMFC is sufficiently overcome by optimizing the operation temperature.

FIG. 4 is a graph illustrating a comparison result of experimental data with a model result depending on the oxygen concentration when an operation temperature is constant at 160° C. It was shown that the model generally has the high matchability with the experimental data. When the current density is 0.2 Acm$^{-2}$, the cell performance depending on the concentration is 0.645, 0.677, and 0.695 V and the prediction ability is very high as 99.84%. When the current density is 0.6 Acm$^{-2}$, the cell performance is 0.519, 0.573, and 0.598 V and in this case, the model prediction ability is 98.1%. That is, the change in the oxygen concentration of the catalyst layer greatly affects the activity overvoltage and the reversible voltage. As the result, it may be confirmed that the change in oxygen concentration very greatly affects the cell performance. Therefore, to obtain appropriate reaction rate parameter having high suitability with the experimental data, it might be confirmed that reflecting the performance prediction depending on the change in oxygen concentration is important.

As the example of the verification of the present invention, the above experiment was performed but the present invention is not limited thereto and therefore may be variously applied.

The generating of the durability model (S20) will be described in more detail.

The generating of the durability model (S20) includes generating a draft model (S21), estimating a coefficient (S22), and generating a non-linear function (S23).

In the generating of the draft model (S21), the effect of the operation temperature is ruled out and the draft model predicting the reduction in cell voltage over the operation time at the predetermined various temperatures is generated.

In the estimating of the coefficient (S22), each coefficient of the draft model over various times generated in the generating of the draft model (S21) is estimated based a function depending on the temperature.

In the generating of the non-linear function (S23), the third-order non-linear function depending on the operation time and temperature is generated using each coefficient estimated in the estimating of the coefficient (S22).

That is, the more reliable empirical durability model may be derived by generating the draft model predicting the reduction in cell voltage over the operation time at various temperatures, estimating each coefficient of the draft model based on the function depending on the temperature, and generating the third-order non-linear function depending on the operation time and temperature using each coefficient.

In this case, for each of the predetermined various temperatures, the draft model in the generating of the draft model (S21) predicts the reduction in cell voltage over the operation time using the draft model corresponding to the following Equation.

$$VD(t)=x_1 t^3 - x_2 t^2 + x_3 t + x_4$$

(the draft models are configured of four coefficients of third-order, second-order, first-order coefficients, and a constant)

The final model is to fit the four coefficients $x_1$, $x_2$, $x_3$, and $x_4$ of the draft model depending on the operation temperature.

As described above, the following experiment was performed to confirm the reliability of the empirical durability model and the empirical durability model will be combined with the theoretical performance model.

For the experiment to confirm the reliability of the empirical durability mode, the experimental results published in Y. Oono, T. Fukuda, A. Sounai, M. Hori, Influence of operating temperature on cell performance and endurance of high temperature proton exchange membrane fuel cells, Journal of Power Sources, 2010; 195-4: 1007-1014 was used.

They performed the long-term durability test of the high temperature PEMFC based on the PBI membrane with which the phosphoric acid is doped at 0.2 Acm$^{-2}$ and 150, 170, and 190° C. Further, they analyzed causes of the performance degradation of the high temperature PEMFC. They showed the performance reduction data up to 16,000 hours at 150° C. To develop the durability model, the present experiment used the performance reduction data over time at 150, 170, and 190° C.

The proposed durability model is based on the third-order non-linear function depending on each operation temperature. The model was developed based on two steps.

First, a draft model predicting the reduction in cell voltage over the operation time at three temperatures while excluding the effect of the operation temperature is developed.

Second, each coefficient of the three draft models developed over time is estimated based on the function depending on the temperature.

Finally, the draft model is developed based on the third-order non-linear function depending on the operation time and temperature using each coefficient estimated depending on the temperature.

The draft model may predict the reduction in each cell voltage over the operation time using the following Equations at the temperature of 150, 170, and 190° C.

$$VD(t)=3.09 \cdot 10^{-11}t^3-6.262 \cdot 10^{-7}t^2+6.0269 \cdot 10^{-3}t+0.9543$$

$$VD(t)=5.735 \cdot 10^{-10}t^3-2.2808 \cdot 10^{-6}t^2+6.861 \cdot 10^{-3}t+1.8992$$

$$VD(t)=1.844 \cdot 10^{-7}t^3-2.3907 \cdot 10^{-4}t^2+1.0698 \cdot 10^{-1}t+0.5512$$

The draft models are configured of four coefficients of third-order, second-order, first-order coefficients, and a constant. The final model is to fit the four coefficients of the draft models depending on the operation temperature.

Here, in the generating of the draft model (S21), the pretreatment process of converting each coefficient into a log value prior to fitting is performed to improve the prediction ability of the draft model.

That is, the pretreatment process of converting each coefficient into the log value prior to fitting is performed and as a result, the prediction ability of the draft model may be improved.

For example, the following Equation reflecting the effect on the cell voltage of the operation temperature and time may be obtained based on each coefficient estimated from the above Equation depending on the temperature of 150, 170, and 190° C.

$$VD(t,T)=x_1 t^3-x_2 t^2+x_3 t+x_4$$

That is, the pretreatment process of converting each coefficient into the log value prior to fitting may be performed to improve the prediction ability and in the above Equation depending on the temperature of 150, 170, and 190° C., the pretreatment process of converting each coefficient into the log value may be performed based on the following Equation.

$$\ln x_1=3.565 \cdot 10^{-3}T^2-0.9947T+44.797$$

$$\ln -x_2=4.199 \cdot 10^{-3}T^2-1.2792T+83.11$$

$$\ln x_3=3.272 \cdot 10^{-3}T^2-1.0404T+77.339$$

$$\ln x_4=-1.113 \cdot 10^{-3}T^2-0.3907T+5.4126$$

FIG. 6 illustrates a cell voltage drop value over time estimated by the draft model. The results predicted from the model coincide with the experiment data well. R-square values of the models for 150, 170, and 190° C. each are 0.9917, 0.9430, and 0.9126, which show that the prediction ability of the models are good. As can be appreciated from FIG. 6, the voltage is remarkably reduced at an early stage and then performance plateau in which the reduction in voltage is reduced is provided. However, after the performance plateau elapses, the voltage is suddenly reduced again. Providing that the cell life determination reference was reduced to 60 mV compared with the initial performance, the cell life was about 16,000, 5,000, and 2,000 hours at 150, 170, and 190° C. FIGS. 7A to 7D illustrate a result obtained by fitting each coefficient of a third-order polynomial depending on the operation temperature. The third-order (a), second-order (b), first-order (c) coefficients and the constant d were each fitted based on the polynomial function. As the regression analysis result, all the R-square values of each coefficient were 0.999 or more. FIGS. 8A to 8C illustrate a comparison result of the durability prediction result with the experimental data over time and temperature. The R-square values of the complex model for 150° C. (a), 170° C. (b), and 190° C. (c) each are 0.9913, 0.9426, and 0.9062. Therefore, it might be confirmed that the reliability of the model depending on the operation time and temperature is high.

In the generating of the performance model (S10), the theoretical performance model was generated and in the generating of the durability model (S20), the empirical durability model was generated.

Further, the model verification was performed by comparing each of the model result with the experiment data.

FIG. 9 illustrates a voltage drop prediction result at various temperatures. As the temperature is reduced, the performance reduction ratio is reduced and the tendency is more remarkable as the temperature is reduced. Over the whole range from 150 to 190° C., the performance reduction ratio is suddenly increased initially and then is slowly stabilized. The performance reduction ratio which is stabilized for some time is remarkably increased again. FIG. 10 illustrates the cell performance over time at various temperatures at 0.2 Acm$^2$. At 150° C., the initial cell voltage is relatively low but is very stable over a long period of time. On the other hand, at 190° C., the initial performance is high but the cell voltage is suddenly reduced over time. Therefore, the cell life at 190° C. is about 10% compared with the cell life at 150° C. Each initial voltage at 150, 170, and 190° C. which is 0.688, 0.679, and 0.668 V, is increased depending on the increase in temperature but the life is greatly reduced. When the cell life determination reference is 0.55V, the life at 150, 170, and 190° C. is predicted as 1,325, 7,015, and 20,111 hours and after the operation is performed for 900, 4,000, and 15,000 hours, the cell performance starts to rapidly reduce. If 4,240 hours elapse after the operation starts, the performance at 150° C. starts to be further increased while overcoming the advantage in that the performance at the early stage of 170° C. is high. FIG. 11 illustrates the life depending on each temperature and the mean performance during the life. Referring to FIG. 11, it may be confirmed that when the operation temperature is reduced, the cell life is increased but the mean performance for the life is reduced.

Next, the optimization model to find out the optimal operation temperature over the target operation time was developed. The mean cell performance for the target operation time is a target function and the determination variable is an operation temperature. The operation temperature range is limited between 150° C. and 190° C. and the operation voltage is limited to 0.55 V or more. FIG. 12 illustrates an optimal operation temperature and a mean cell voltage over the target operation time. When the target operation time is 1000 hours, the mean performance at 181.5° C. shows the high performance as 0.6857 V. As the target operation time is increased, the optimal operation temperature is suddenly reduced and thus the mean voltage is also reduced. When the operation target time is 20,000 hours, the mean performance of 0.630 V is shown at the cell operation temperature of 150° C. Therefore, the operation temperature needs to be low for the long-term operation, but when the shorter life is required, the operation at high temperature is proposed. That is, in the case of the short-term operation, increasing the operation temperature may improve the overall performance.

FIG. 13 illustrates the mean performance prediction value over time when the operation is performed at 150, 160, 170° C., and the optimal operation temperature. FIG. 13 illustrates how much arbitrarily setting the operation temperature has an adverse effect on the performance of the high temperature PEMFC. At the operation at 170° C., the good mean performance is shown at the early stage, but the operation time is long and the performance is suddenly reduced. Even in the case of 160° C., a similar aspect to 170° C. is shown.

As the example of the verification of the present invention, the experiment as described above is performed, but the present invention is not limited thereto and therefore may be variously applied.

The performance and durability of the high-temperature PEMFC based on the PBI membrane with which the phosphoric acid is doped rely on the operating conditions. Therefore, it is very important to set appropriately the operating conditions over the target operation time.

The present invention is to predict the performance and durability of the high temperature PEMFC based on the PBI with which the phosphoric acid is doped depending on the operating conditions and derive the optimal operating conditions for the target operation time and in the estimating of the operating condition (S40) of the method for optimization of fuel cells operating conditions using a hybrid model according to the exemplary embodiment of the present invention, when the target life is maximum, the operation temperature is kept at 150 to 160° C.

According to the method for optimization of fuel cells operating conditions using a hybrid model in accordance with the exemplary embodiment of the present invention, the life prediction model (hybrid model) determined by the time and temperature based on the theoretical performance model and the empirical durability model is generated and as a result, the optimal operation temperature in the target life may be derived.

Further, the potential difference depending on the current density of the cell is obtained by subtracting the activity loss, the resistance loss, the concentration loss from the thermodynamics reversible voltage, thereby deriving the more reliable theoretical performance model.

Further, the draft model predicting the reduction in cell voltage over the operation time at various temperatures is generated, each coefficient of the draft model is estimated based on the function depending on the temperature, and the third-order non-linear function depending on the operation time and temperature is generated based on each coefficient and as a result, the more reliable empirical durability model may be derived.

Further, the pretreatment process of converting each coefficient into the log value prior to fitting is performed and as a result, the prediction ability of the draft model may be improved.

The present invention is not limited to the above-mentioned exemplary embodiments, and may be variously applied, and may be variously modified without departing from the gist of the present invention claimed in the claims.

What is claimed is:

1. A method for adjusting operating conditions of a fuel cell with an aid of a computing device including an empirical durability model generating unit, an optimal operation temperature estimating unit, and a memory including executable instructions stored thereon, the method comprising:

obtaining a potential difference depending on a current density of a cell based on a thermodynamics reversible voltage, an activity loss, a resistance loss, and a concentration loss of a high temperature proton-exchange membrane fuel cell (PEMFC) including a polybenzimidazole (PBI) membrane with which phosphoric acid is doped (S10);

generating an empirical durability model which predicts a reduction in cell voltage over an operation time at a predetermined temperature (S20) at the empirical durability model generating unit;

determining an optimal operation temperature at a target life based on the potential difference depending on a current density of the PEMFC (S10) and the durability model generated in the generating of the empirical durability model (S20) (S40) at the optimal operation temperature estimating unit; and adjusting an operation temperature of the PEMFC to the optimal operation temperature, wherein the generating of the durability model (S20) includes:

generating a draft model predicting the reduction in cell voltage over the operation time at the predetermined various temperatures while ruling out an effect of the operation time (S21);

performing a durability test of the PEMFC which detects the reduction in cell voltage for a predetermined period at the predetermined various temperatures;

estimating coefficients of the draft model over various times generated in the generating of the draft model (S21) based on the reduction in cell voltage detected in the durability test of the PEMFC (S22); and generating a third-order non-linear function depending on the operation time and temperature using the coefficients estimated in the estimating of the coefficient (S22) (S23), and wherein for each of the predetermined various temperatures, the draft model in the generating of the draft model (S21) predicts the reduction in cell voltage over the operation time using the draft model corresponding to the following Equation:

$$VD(t)=x_1t^3-x_2t^2+x_3t+x_4, \text{ and}$$

a final model which is used at the durability model is to fit the four coefficients $x_1$, $x_2$, $x_3$, and $x_4$ of the draft model depending on the operation temperature.

2. The method of claim 1, wherein the potential difference depending on a current density of the PEMFC is obtained by subtracting the activity loss, the resistance loss, and the concentration loss from the thermodynamics reversible voltage based on the following Equation:

$$E_{cell} = E_{rev} - \eta_{act} - \eta_{ohm} - \eta_{conc}$$

In the above Equation, $E_{cell}$ represents the potential difference depending on a current density of the PEMFC, $E_{rev}$ represents the thermodynamics reversible voltage, $\eta_{act}$ represents the activity loss, $\eta_{ohm}$ represents the resistance loss and $\eta_{conc}$ represents the concentration loss.

3. The method of claim 2, wherein the thermodynamics reversible voltage is calculated based on the following Equation, $$E^{ref} = -\frac{\Delta g_{rx}^{ref}}{nF}.$$

In the above Equation, $\Delta g_{rx}^{ref}$ represents Gibbs' free energy and F represents a Faraday constant and n represents number of transfer electrons, the thermodynamics reversible voltage at a given temperature T is calculated based on the following Equation by introducing a change in entropy depending on temperature, $$E_T = E^{ref} + \frac{\Delta s}{nF}(T - T_{ref}).$$

In the above Equation, $\Delta s$ represents the change in entropy depending on the temperature and $T_{ref}$ represents reference temperature, when a concentration of chemical species is specified, the thermodynamics reversible voltage is calculated based on the following Equation by introducing activity, and $$E_{rev} = E^{ref} - \frac{RT}{nF}\ln\frac{a_{H_2O}}{a_{H_2}a_{O_2}^{0.5}}.$$

In the above Equation, R represents an abnormal gas constant and a represents activity, and at the given temperature T and concentration c, the thermodynamics reversible voltage is calculated based on the following Equation $$E_{rev} = E^{ref} + \frac{\Delta s}{nF}(T - T_{ref}) - \frac{RT}{nF}\ln\frac{a_{H_2O}}{a_{H_2}a_{O_2}^{0.5}}.$$

4. The method of claim 2, wherein the activity loss is calculated by the following Equation:

$$j_{gross} = j_0(e^{\alpha n F \eta_c/RT} - e^{-(1-\alpha)nF\eta_c/RT})$$

$$j_{gross} = j_0 e^{\alpha n F \eta_c/RT}$$

$$\eta_c = \frac{RT}{\alpha nF}\ln\frac{j + j_{leak}}{j_0}$$

$$j_0 = j_0^{ref} S_{Pt}^{eff}\left(\frac{c_{O_2}}{c_{O_2}^{ref}}\right)\gamma e^{\frac{\Delta b_{act}}{RT}\left(1 - \frac{T}{T^{ref}}\right)}.$$

In the above Equation, n represents number of transfer electrons and a represents a transfer coefficient, a total of current density $j_{gross}$ includes an operating current density j, an internal current, and a loss current $j_{leak}$ occurring due to a leakage of reactants, by being focused on a high current density area in which a reverse reaction is disregarded, a second exponential term of the right terms representing the reverse reaction is disregarded, an exchange current density $j_0^{ref}$ is corrected depending on a concentration and a temperature value, a reference exchange current density $j_0^{ref}$ measured based on a reference temperature $T^{ref}$ and a reference oxygen concentration $c_{O_2}^{ref}$, $S_{Pt}^{eff}$ represents an effective platinum surface area, $c_{O_2}$ represents an oxygen concentration in the catalyst layer, and $\gamma$ represents a reaction order, $j_0^{ref}$ and $S_{Pt}^{eff}$ are estimated based on the experimental data, and an activity barrier energy $\Delta b_{act}$ uses 7.24·104 Jmol$^{-1}$.

5. The method of claim 2, wherein the resistance loss is represented by the following Equations:

$$\eta_{ohm} = j\frac{\delta_m}{\kappa_m}$$

$$\kappa_m = \frac{AB}{T}e^{-\frac{b_{act}}{RT}}$$

$$b_{act} = -619.6DL + 21750$$

$$A = 168DL^3 - 6324DL^2 + 65750DL + 8460$$

$$B = 1 + (0.1432T - 56.89)RH^{eff}.$$

In the above Equation, $\delta_m$ and $k_m$ each represent the thickness and ion conductivity of the membrane, the ion conductivity of the PBI membrane relies on a doping level (DL) of the phosphoric acid, relative humidity (RH), and temperature T, temperature dependency of ion conductivity relies on an Arrhenius law, A and B are pre-exponential coefficients describing an effect of the phosphoric acid doping level and the relative humidity, respectively, $b_{act}$ represents the activation energy of the membrane.

6. The method of claim 1, wherein in the generating of the draft model (S21), a pretreatment process of converting each coefficient into a log value prior to fitting is performed to improve a prediction ability of the draft model.

7. The method of claim 1, wherein in the of the operating condition (S40), when the target life is maximal, the operation temperature is kept at 150 to 160° C.

8. The method of claim 1, wherein in the performing the durability test of the PEMFC, the PEMFC is heated from room temperature to the predetermined temperature as purged with nitrogen, and then dry hydrogen and dry air which are heated up to the predetermined temperature by a line heater in a hydrogen and oxygen supply pipe are supplied to an anode and a cathode of the PEMFC, respectively.

* * * * *